US012755780B2

(12) United States Patent
Chen et al.

(10) Patent No.: US 12,755,780 B2
(45) Date of Patent: Oct. 6, 2026

(54) MEMORY DEVICES WITH RC TRACKING AND METHODS FOR OPERATING THE SAME

(71) Applicant: Taiwan Semiconductor Manufacturing Company, Ltd., Hsinchu (TW)

(72) Inventors: Chien-Yuan Chen, Hsinchu City (TW); Hau-Tai Shieh, Hsinchu City (TW); Cheng Hung Lee, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 129 days.

(21) Appl. No.: 18/410,739

(22) Filed: Jan. 11, 2024

(65) Prior Publication Data

US 2025/0232804 A1 Jul. 17, 2025

(51) Int. Cl.

| | |
|---|---|
| ***G11C 11/419*** | (2006.01) |
| ***G11C 11/412*** | (2006.01) |
| ***H10B 10/00*** | (2023.01) |

(52) U.S. Cl.

CPC .......... *G11C 11/419* (2013.01); *G11C 11/412* (2013.01); *H10B 10/12* (2023.02)

(58) Field of Classification Search

CPC .................................................... G11C 11/419

See application file for complete search history.

(56) References Cited

U.S. PATENT DOCUMENTS

| | | | | |
|---|---|---|---|---|
| 11,735,251 B2 * | 8/2023 | Yang | G11C 11/419 | 365/154 |
| 2007/0183191 A1 * | 8/2007 | Kim | G11C 11/4099 | 365/49.17 |
| 2010/0118628 A1 * | 5/2010 | Wang | G11C 7/227 | 365/194 |
| 2010/0284232 A1 * | 11/2010 | Wang | G11C 7/12 | 365/194 |
| 2012/0307574 A1 | 12/2012 | Cheng et al. | | |
| 2013/0094309 A1 * | 4/2013 | Wang | G11C 7/227 | 365/191 |
| 2013/0329505 A1 * | 12/2013 | Yang | G11C 7/227 | 365/189.11 |

(Continued)

FOREIGN PATENT DOCUMENTS

TW 514928 B 12/2002

OTHER PUBLICATIONS

Office Action issued in connection with Taiwan Appl. No. 113115167 dated Nov. 27, 2024 (machine translation).

*Primary Examiner* — Douglas King

(74) *Attorney, Agent, or Firm* — Foley & Lardner LLP

(57) ABSTRACT

A memory circuit includes a memory array comprising a plurality of memory cells arranged over a plurality of word lines and along a bit line, and a controller operatively coupled to the memory array and comprising an RC detector. The RC detector is configured to advance a timing for a first tracking signal to fall, subsequently to a second tracking signal transitioning to rise and prior to a third tracking signal transitioning to rise. The first tracking signal is conducted through a first tracking line, the second tracking signal is provided to conduct through a second tracking line, and the third tracking signal is conducted through the second tracking line.

20 Claims, 7 Drawing Sheets

(56) References Cited

U.S. PATENT DOCUMENTS

| | | | | |
|---|---|---|---|---|
| 2013/0343139 | A1* | 12/2013 | Evans | G11C 8/18<br>365/194 |
| 2014/0269026 | A1* | 9/2014 | Tao | G11C 11/419<br>365/191 |
| 2018/0068714 | A1* | 3/2018 | Liang | G11C 11/419 |
| 2019/0392889 | A1* | 12/2019 | Trivedi | G06F 1/3275 |
| 2020/0106598 | A1 | 4/2020 | Stott et al. | |
| 2020/0342916 | A1* | 10/2020 | Chhabra | G11C 11/413 |

* cited by examiner

MEMORY DEVICES WITH RC TRACKING AND METHODS FOR OPERATING THE SAME

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
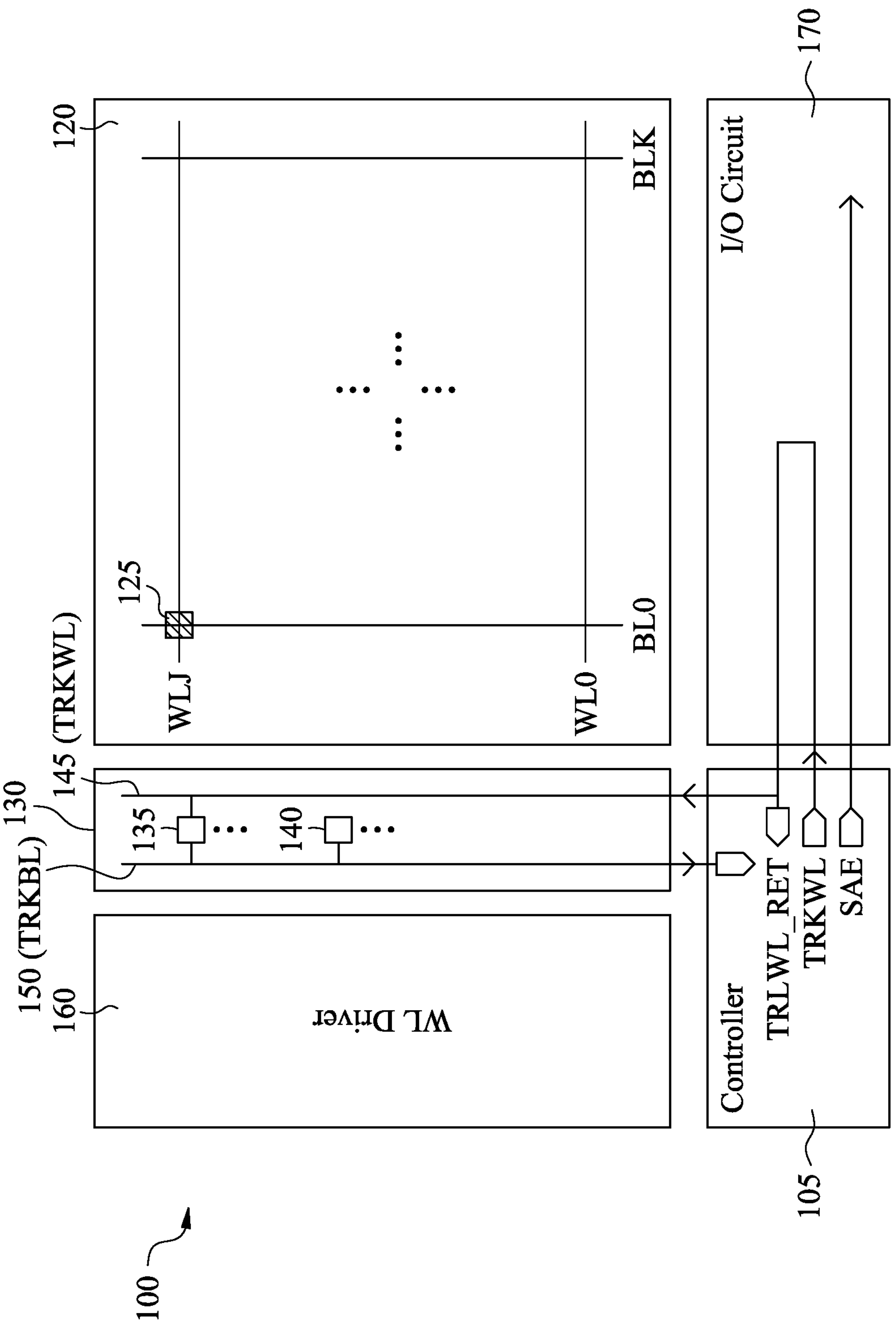
FIG. 1 illustrates an example block diagram of a memory device that includes a memory controller configured to adjust the pulse width of a word line signal, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” “top,” “bottom” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A static random access memory (SRAM) device is a type of volatile semiconductor memory that stores data bits using bistable circuitry that does not need refreshing. An SRAM cell may be referred to as a bit cell or memory cell because it stores one bit of information, represented by the logic state of two cross coupled inverters. Memory arrays include multiple bit cells arranged in rows and columns. Each bit cell in a memory array typically includes connections to a power supply voltage and to a reference voltage. Logic signals on bit lines control reading from and writing to a bit cell, with a word line controlling connections of the bit lines to the inverters. A word line may be coupled to the bit cells in a row of a memory array, with different word lines provided for different rows.

Each successive bit cell along a bit line or word line has a characteristic input capacitance, and each conductor leg between bit cells has a resistance, leading to a signal propagation delay. The delay is longer for bit cells that are farther than others along signal paths beginning at the source of memory addressing and control signals, such as the outputs of address decoding gates and line drivers coupled at an edge of the memory array. The delay affects the time needed to access the bit cells and limits the highest frequency at which the memory can be operated. The time taken to access an SRAM bit cell, e.g., for a read/write operation, may vary due to several factors including the relative position of the accessed bit cell within the SRAM array. Reliable estimation of SRAM timing characteristics is important for ensuring consistency in system components and high system performance.

In this regard, various techniques have been proposed to provide timing tracking functionality for accurate, efficient monitoring of an SRAM device. Timing tracking enables determination of when a bit cell finishes a read or write operation. For example, a tracking word line is typically modified or otherwise enlisted from an existing word line of a memory array to track or mimic the propagation time of a signal conducted through a normal word line of the memory array, and a tracking bit line, typically modified or otherwise enlisted from an existing bit line of the memory array that to track or mimic the propagation time of a signal conducted through a normal bit line of the memory array, may not accurately track the propagation time. A signal conducted through the tracking bit line typically responds in accordance with a signal conducted through the tracking word line.

With the trend of ever increasingly shrunken feature size (e.g., smaller and/or thinner conductor legs), an RC delay in the memory array increases accordingly, which disadvantageously slows the signal conducted through the tracking word line. In turn, the signal conducted through the tracking bit line cannot accurately track the propagation time. Such issues may become more significant when the memory device operates with a certain condition (e.g., with high voltage and/or high temperature). Thus, the existing timing tracking techniques or corresponding circuits for an SRAM device have not been entirely satisfactory in certain aspects.

The present disclosure provides various embodiments of a memory device including a controller and at least one memory array that are operatively coupled to each other. In various embodiments, the controller can adjust the timing of a tracking bit line signal based on an operating condition of the memory device. For example, the controller may include an RC detector that can advance the timing for a tracking signal conducted through a tracking bit line (sometimes referred to as "TRKBL signal") to fall based on the operating condition of the memory device. In some embodiments, the RC detector may include a first transistor gated by a signal provided to conduct through a tracking word line (sometimes referred to as "TRKWL signal") and a second transistor gated by another signal conducted through and returning from the tracking word line (sometimes referred to as "TRKWL_RET signal"). Further, the first transistor and the second transistor are connected in series to the tracking bit line, with a voltage at one of the source/drain terminals of the first transistor maintained at an almost constant level. Under a certain operating condition (e.g., high voltage and/or high temperature), the TRKWL signal can cause the first transistor to conduct a higher current thereby advancing the timing to pull down the TRKBL signal, e.g., prior to the TRKWL_RET signal returns from the tracking word line. As such, the RC delay that the existing memory device faces when operating with a high-voltage/temperature condition can be compensated. Stated another way, even with the RC delay, the advanced timing provided by the currently disclosed RC detector can make up for such a delay.

FIG. 1 illustrates a block diagram of a memory device or circuit 100, in accordance with various embodiments. The memory device 100 shown in FIG. 1 is simplified for illustration purposes, and thus, it should be appreciated that the memory device 100 can include any of various other components while remaining within the scope of the present disclosure.

As shown, the memory device 100 includes a memory controller 105 and a memory array 120. The memory array 120 may include a plurality of storage circuits or memory cells 125 arranged in two-or three-dimensional arrays. Each memory cell 125 may be coupled to one or more corresponding word lines (WLs) and one or more corresponding bit line (BLs). The memory controller 105 can write data to or read data from the memory array 120 according to electrical signals through word lines WL and bit lines BL. Further, according to various embodiments of the present disclosure, the memory controller 105 can adjust the pulse width of a WL signal conducted through a corresponding asserted word line WL based on a physical distance between the asserted word line and the memory controller 105, which will be discussed in further detail below. In other embodiments, the memory device 100 includes more, fewer, or different components than shown in FIG. 1.

The memory array 120 is a hardware component that stores data. In one aspect, the memory array 120 includes a plurality of storage circuits or memory cells 125. The memory array 120 includes word lines WL0 . . . WLJ, each extending in a first direction (e.g., X-direction) and bit lines BL0 . . . BLK, each extending in a second direction (e.g., Y-direction). In some embodiments, the memory array 120 may be referred to as having a number of columns and a number of rows, where each of the columns corresponds to a respective one of the bit lines BLs and each of the rows corresponds to a respective one of the word lines WLs. That is, the memory array 120 can include K columns and J rows of the memory cells 125. The word lines WLs and the bit lines BLs may each be a conductive metal or conductive rail. Each memory cell 125 is coupled to a corresponding word line WL and a corresponding bit line BL, and can be operated according to voltages or currents through the corresponding word line WL and the corresponding bit line BL. In some embodiments, each bit line includes bit lines BL, BLB coupled to one or more memory cells 125 of a group of memory cells 125 disposed along the second direction (e.g., Y-direction). The bit lines BL, BLB may receive and/or provide differential signals. Each memory cell 125 may include a volatile memory, a non-volatile memory, or a combination of them. In some embodiments, each memory cell 125 is embodied as a static random access memory (SRAM) cell or other type of memory cell. In some embodiments, the memory array 120 includes additional lines (e.g., select lines, reference lines, reference control lines, power rails, etc.).

In addition to the memory cells 125 that are configured to store data (which are sometimes referred to as nominal memory cells), the memory array 120 may include one or more tracking columns 130 disposed next to or integrated into the memory array 120, as shown in FIG. 1. The tracking column 130 can each include a number of tracking cells 135 and a number of dummy cells 140. The tracking cells 135 and the dummy cells 140 may be configured in any respective numbers, with a total number of the tracking cells 135 and dummy cells 140 equal to the number of rows (J), while remaining within the scope of the present disclosure. For example, the number of tracking cells 135 may be selected to simulate a worst case condition in a write and/or read operation.

Further, the tracking column 130 can include at least one tracking word line 145 and at least one tracking bit line 150, in which the tracking word line 145 is connected to each of the tracking cells 135, and the tracking bit line 150 is connected to each of the tracking cells 135 and dummy cells 140. The tracking word line 145 and tracking bit line 150 are configured to conduct the above-mentioned TRKWL_RET signal and the TRKBL signal, respectively, which will be discussed in further detail below. By conducting the TRKWL_RET and TRKBL signals, the tracking word line 145 and tracking bit line 150 can respectively emulate signal routing delays in a functional memory array (e.g., 120) for a read or write operation at the far edge.

For example, the tracking word line 145 may include a first horizontal portion extending along the rows of the memory array 120, a second horizontal portion also extending along the rows of the memory array 120, and a vertical portion extending along the columns of the memory array 120. A length of each of the first and second horizontal portions of the tracking word line 145 may be approximately equal to one half of a width of the memory array 120 (e.g., a distance along any of the rows from one edge of the array to the other, according to the orientation of the memory array in FIG. 1); and a length of the vertical portion of the tracking word line 145 may be approximately equal to a height of the memory array (e.g., a distance from the memory controller 105 to the farthest tracking cell 135, according to the orientation of the memory array in FIG. 1). For example, in FIG. 1, the first portion of the tracking word line 145 may (e.g., physically) extend from the memory controller 105 to a mid-point of the memory array 120, and the second portion of the tracking word line 145 may (e.g., physically) return from the mid-point of the memory array 120 to the memory controller 105. Accordingly, a sum of the lengths of the first and second portions of the tracking word line 145 may be equal to a length of each of the word lines WLs, such that the metal routing delay for accessing a cell at the top right corner of the memory array 120 is emulated, e.g., the delay from signal entry at the bottom left, propagating horizontally and vertically, over a path distance equal to the length of a path from one corner to the diagonally opposite corner.

In general, the tracking cells 135 do not function as the (nominal) memory cells 125 do in terms of storing data and supporting read/write operations. Rather, the tracking cells 135 may originally be a subset of the nominal memory cells 125 but be enlisted, or re-purposed, for timing tracking. For example, the tracking cells 135 are bit cells with fixed logic values configured and coupled to one another so as to respond in a predictable way when addressed by test or tracking signals. A non-limiting implementation of the tracking cell 135, together with a non-limiting implementation of the nominal memory cell 125, will be discussed below in FIG. 2. The dummy cells 140 enable the capacitive and resistive environment to be matched closely for accurate modeling of the environment for nominal memory cells. Bit lines that are tracked typically have two factors that determine propagation delay of signals that are carried, namely serial resistance and parallel capacitance. The dummy cells 140 have real capacitive load, and mimic the capacitance of bit lines BLs coupled to the nominal memory cells. If the dummy cells 140 were not provided, the length of the tracking bit line would effectively appear to be shorter than the nominal bit lines BLs they are intended to emulate, which would decrease resistance and capacitance, and which might lead tracking circuitry to determine that read or write operations have concluded prematurely.

The memory controller 105 is a hardware component that is configured to control various operations of the memory array 120 such as, reading data bits from the memory cells 125, writing data bits into the memory cells 125, performing a tracking scheme on respective timings of the read/write operation, adjusting the tracking timings of the read/write operation, etc. In various embodiments, the memory controller 105 can include a number of circuits, each of which may be embodied as logic circuits, analog circuits, or a combination of them, to perform such operations.

For example, the memory controller 105 can include a clock generator, a pulse generator, and an RC detector. The clock generator can receive or generate a clock signal, and provide the clock signal for the pulse generator to generate a number of clock pulses. The pulse generator can rely on the clock pulses to control (e.g., pull up and/or down) a number of control signals (e.g., TRKWL signal, TRIG signal, SAE signal). The RC detector can provide the TRKWL signal to be conducted through the tracking word line 145 and receive the TRKWL_RET signal conducted through the tracking word line 145. Based on an operating condition of the memory device 100 (e.g., high-voltage condition or low-voltage condition), the RC detector can selectively adjust a transition timing of the TRKBL signal. The selectively adjusted TRKBL signal can be further received by the pulse generator, which causes the clock pulses to be adjusted. Such adjusted clock pulses can be utilized to adjust a transition timing of the TRIG signal and/or the SAE signal, which can advantageously read and/or write margin of the memory device 100. Details of these circuit components of the memory controller 105 will be discussed further with respect to FIG. 3.

In some embodiments, the memory device 100 can further include various other circuit components such as, for example, a word line driver/controller 160, an input/output (I/O) circuit 170, etc., each of which may be embodied as logic circuits, analog circuits, or a combination of them. The word line driver 160 can provide a voltage or current conducted through one or more word lines WL of the memory array 120. Such a voltage/current may sometimes be referred to as a WL signal. The I/O circuit 170 can sense a voltage or current conducted through one or more bit lines BLs of the memory array 120. For example, the I/O circuit 170 may include a number of sense amplifiers, each of which is operatively coupled to one or more of the bit lines BLs inside the memory array 120. These sense amplifiers may be activated by the SAE (sense amplifier enable) signal, which is pulled up by the TRIG (triggering) signal. Upon the SAE signal being pulled up to a certain voltage level, the WL signal can be pulled down. Stated another way, the memory controller 105 can utilize the adjusted timing of the SAE signal to adjust a pulse width of this WL signal based on the operating condition of the memory device 100. Advantageously, various performance (e.g., power consumption, RC delay, etc.) of the memory device 100 can be improved.

Figure 2:
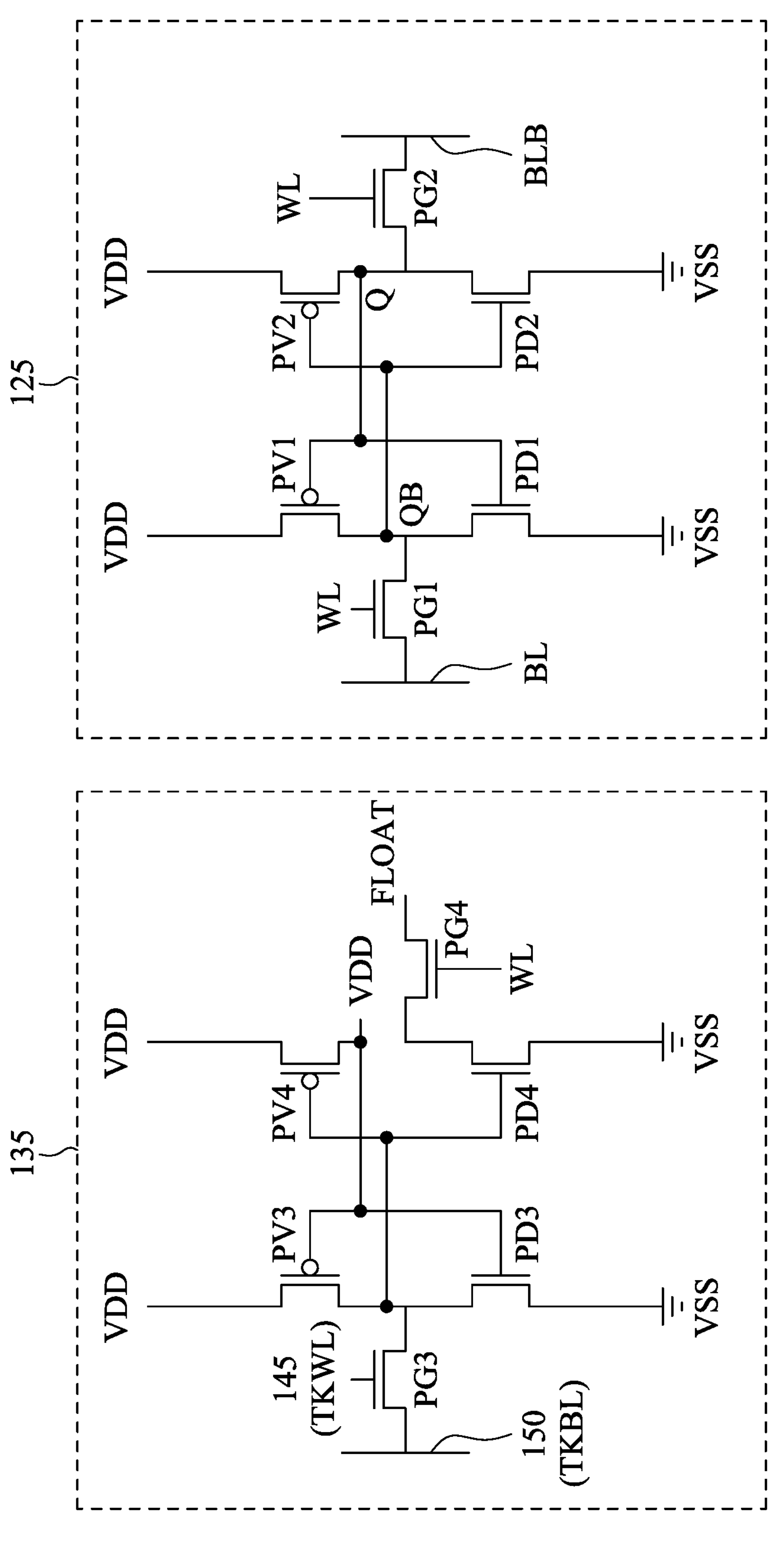
FIG. 2 illustrates a schematic diagram of a nominal memory cell and a tracking cell of the memory device of FIG. 1, in accordance with some embodiments.

FIG. 2 illustrates a schematic diagram of an example implementation of the nominal memory cell 125 and the tracking cell 135, in accordance with various embodiments. In general, the tracking cell 135 may have the same structure as the nominal memory cell 125, but be operatively configured differently. In FIG. 2, the nominal memory cell 125 is implemented as a six-transistor (6T) static random access memory (SRAM) cell that consists of six transistors, and accordingly, the tracking cell 135 may also have six transistors.

As shown in FIG. 2, the nominal memory cell 125 includes a pair of access transistors PG1 and PG2 biased by a word line WL and providing access to cross-coupled first and second inverters, respectively. "PG" in PG1 and PG2 may be referred to as "passing gate" because they pass bit lines signals to the nodes of the cross-coupled inverters when the WL signal at the gate terminal of transistors PG becomes true. The first inverter includes a pull-up PMOS transistor PUI and a pull-down NMOS transistor PD1, and the second inverter includes a pull-up PMOS transistor PU2 and a pull-down NMOS transistor PD2. The transistors PG1 and PG2 respectively are coupled to a first bit line BL ("bit line") and to a second bit line BLB ("bit line bar" or bit line complement). This configuration is referred to as a 6T (six-transistor) configuration. During standby mode, the WL is not asserted, and the access transistors PG1 and PG2 disconnect the memory cell 125 from the bit lines, the BL and BLB. The cross-coupled inverters are coupled between the power supplies (VDD and VSS), and reinforce each other to maintain one of two possible logic states with a stored data bit at one of the nodes between the inverters (node Q) and the complement of that bit at the other node between the inverters (node QB). For a read operation, the BL and BLB are pre-charged to a high logic state, and the WL is asserted. The stored data bit at the node Q is transferred to the BL, and the data bit at the node QB is transferred to the BLB. For a write operation, the value to be written is provided at the BL, and the complement of that value is provided at the BLB, when the WL is asserted. Although 6T SRAM cells are herein described, other types of memory cells may be used as well, including types of memory other than SRAM and other types of SRAM configurations than 6T, e.g., eight transistor (8T) or ten transistor (10T) configurations.

In such memory configurations of the nominal memory cells 125, one or more of the nominal memory cells 125 can be operatively enlisted or re-configured as the tracking cells 135 to perform a tracking scheme. The tracking scheme can generally follows the steps below: (1) a transistor in at least one storage node of the tracking cell 135 is maintained in a conductive (or nonconductive) condition characteristic of its condition in a predetermined logic state (e.g., forced to a condition representing logic high), the transistor being switched to the opposite conductive (or nonconductive) condition by the TRKBL signal conducted through a route otherwise used in the array 120 as the tracking bit line 150; (2) a word line similarly is decoupled from a normal (nominal) cell array and is coupled to a conductive route (originally used as a bit line in an adjacent nominal cell) to carry the TRKWL signal, e.g., the tracking word line 145; and (3) when the TRKWL signal turns on the transistor (such as a PG transistor and a PD transistor of the tracking cell 135 in an SRAM example), a current from the tracking bit line 150 to VSS is generated and can be detected to stop and/or read a timer that was started when the TRKBL signal was generated. In this way, the representative time delay to and from the tracking cell 135 provides a measure from which the delays along other paths are inferred, e.g., in an SRAM. The tracking scheme and corresponding configuration, as described above, can also be applied to 8T and 10T configurations.

Referring still to FIG. 2, the tracking cell 135 is substantially similar to the nominal memory cell 125, but with modifications that enlist certain components for tracking functionality. For example, the tacking cell 135 may include two NMOS PG transistors (PG3 and PG4), two PMOS PU transistors (PU3 and PU4), and two NMOS PD transistors (PD3 and PD4). The PG4 transistor is coupled to a floating node, as denoted by FLOAT, and has a gate coupled to a corresponding nominal word line WL, which may be extended from the memory array 120 (e.g., coupled to one or more of the memory cells 125). The word line WL is disabled from accessing the tracking cell 135 due to the floating node. In the illustrative example of FIG. 2, the PU-PD pair at the right (PU4 and PD4) does not have drain terminals connected to each other. Such disconnection may prevent current from flowing from VDD (that ties a node high to force the state of an inverter formed by the PU-PD pair at the left, i.e., PU3 and PD3) through the PG4 transistor to a nominal bit line BL (of the memory array 120) when the nominal word line WL has a logical high value. In other embodiments, the drain terminals of the PU-PD pair at the right (PU4 and PD4) may be connected to each other.

Further, the PG3 transistor has a gate connected to the tracking word line 145 to receive the TRKWL signal, and a drain terminal connected to the tracking bit line 150 to present the TRKBL signal. In general, when performing a tracking scheme, the tracking bit line 150 may be first pre-charged to a logical high voltage value, e.g., VDD, through a control transistor (not shown) that has its gate connected to the tracking word line 145. Next, the TRKWL signal conducted through the tracking word line 145 may be pulled up (to a high logic state), which can turn off the control transistor (when implemented as a PMOS transistor) thereby decoupling the tracking bit line 150 from VDD. Accordingly, the PG3 transistor is turned on, while the PD3 transistor is maintained at an "on" state by tying its gate to VDD, thereby allowing current to flow from the tracking bit line 150 to ground (VSS). As such, the formerly high voltage at the tracking bit line 150 starts to discharge to ground, and the pulled-low tracking bit line 150 is coupled (e.g., feeding back the TRKBL signal) to the memory controller 105 (FIG. 1). The pulled-low TRKBL signal that arrives at the memory controller 105 may be measured for timing tracking, as the read/write operation emulated in the functional SRAM (e.g., the nominal memory cells 125) has been completed. Further, the memory controller 105 can utilize the pulled-down TRKBL signal to fire (e.g., pull up) the TRIG signal, which in turn pulls up the SAE signal. The pulled-up SAE signal can cause the WL signal to be pulled down, which determines a pulse width of the WL signal.

Figure 3:
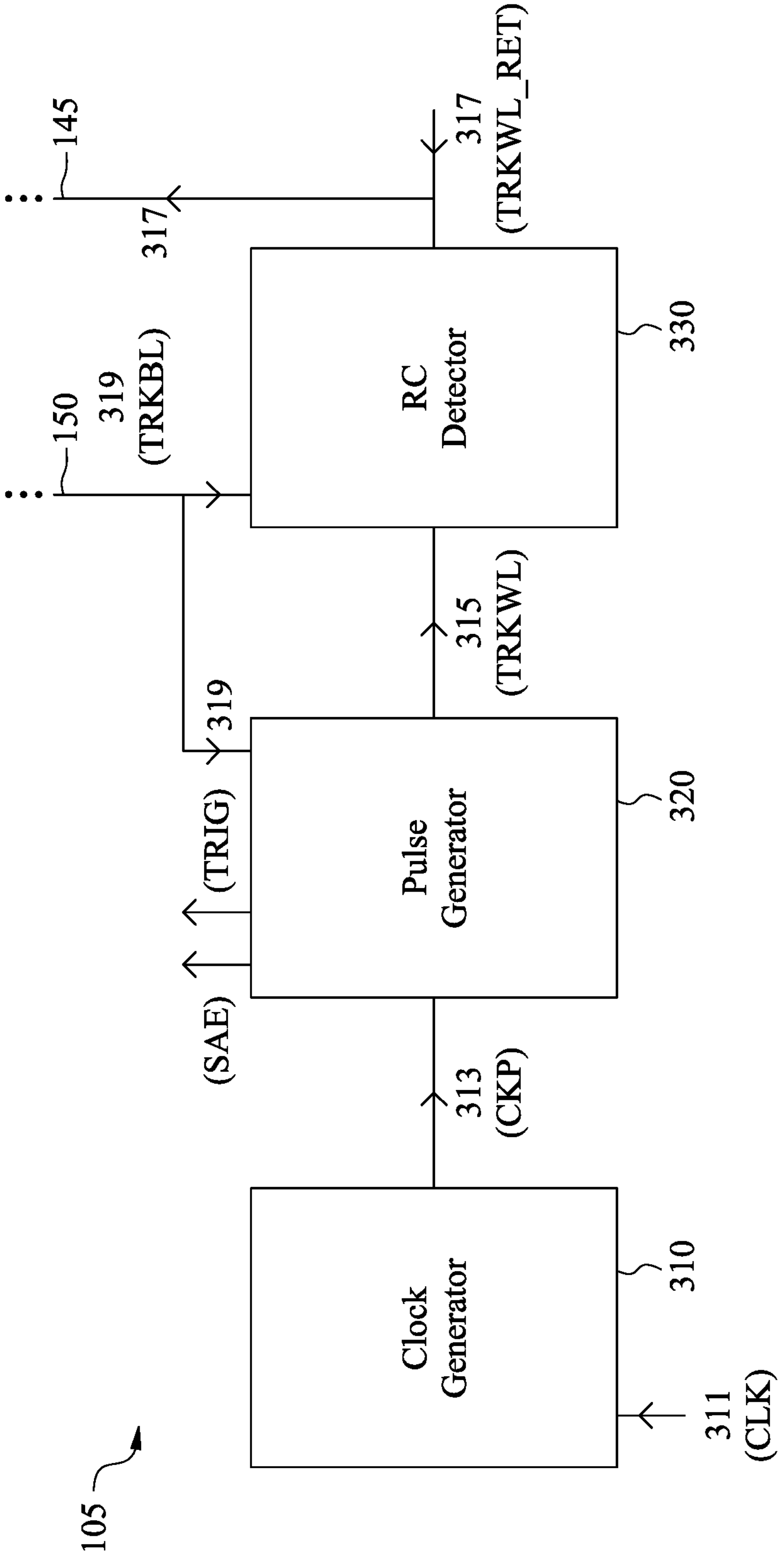
FIG. 3 illustrates a block diagram of the memory controller of FIG. 1, in accordance with some embodiments.

FIG. 3 illustrates a block diagram of a portion of the memory controller 105 (FIG. 1) that can adjust the timing of a falling edge of the TRKBL signal based on an operating condition of the memory device 100, in accordance with various embodiments. As such, the memory controller 105 can utilize the adjusted timing of the TRKBL signal to shorten the pulse width of a WL signal conducted through an asserted word line WL. In FIG. 3, the memory controller 105 is simplified for illustrative purposes, and thus, it should be appreciated that the memory controller 105 can include any of various other components while remaining within the scope of the present disclosure.

As shown, the memory controller 105 includes a clock generator 310, a pulse generator 320, and an RC detector 330. The clock generator 310 can receive a clock signal 311, and provide a number of clock pulses 313 based on the clock signal 311. In some embodiments, at least one transition edge of the clock pulse 313 can follow the clock signal 311. For example, when the clock signal 311 is pulled up, the clock pulse 313 is also pulled up. Stated another way, a rising edge of the clock pulse 313 follows a rising edge of the clock signal 311. The clock generator 310 can provide the clock pulse 313 to the pulse generator 320. In addition, the clock generator 310 can provide the clock pulse 313 to drive other circuit components of the memory device 100 such as, for example, the word line driver 160 (FIG. 1).

Upon receiving the clock pulse 313, the pulse generator 320 can generate a tracking word line (TRKWL) signal 315 conducted through the tracking word line 145, and further provide the TRKWL signal 315 to the RC detector 330. The TRKWL signal 315 can be configured to turn on or otherwise activate the tracking cell 135. In some embodiments, at least one transition edge of the TRKWL signal 315 can follow the clock pulse 313. For example, when the clock pulse 313 is pulled up, the TRKWL signal 315 is also pulled up. Stated another way, a rising edge of the TRKWL signal 315 follows a rising edge of the clock pulse 313. Further, the TRKWL signal 315 is provided by the RC detector 330 to be conducted through the (e.g., first and second) horizontal portions of the tracking word line 145. Stated another way, in the illustrative embodiment of FIG. 1, the TRKWL signal 315 is fed into the first horizontal portion of the tracking word line 145 from its beginning that is about aligned with one edge of the memory array 120. Next, the TRKWL signal 315 flows through the first and second horizontal portions of the tracking word line 145 and returns as TRKWL_RET signal 317. In some embodiments, the TRKWL_RET signal 317 can further flow through the vertical portion of the tracking word line 145 to activate (e.g., turn on) the tracking cells 135 (FIG. 1). Upon the tracking cells 135 being activated, a tracking bit line (TRKBL) signal 319 conducted through the tracking bit line 150, which has been pre-charged to a high logic state (e.g., VDD), can start being pulled down. A timing of the TRKBL signal 319 being pulled down to a certain voltage level can correspond to the finish timing of a corresponding tracking scheme, according to various embodiments of the present disclosure.

As will be discussed below, the RC detector 330 includes at least two transistors gated by the TRKWL signal 315 and the TRKWL_RET signal 317, respectively. Further, these two transistors are connected to each other in series and further coupled to the tracking bit line 150. Since the different timings of the rising edges of the TRKWL signal 315 and the TRKWL_RET signal 317, which may sometimes be utilized as an index for monitoring an operating condition of the memory device 100, these two transistors may be turned on non-simultaneously. Stated another way, a time window may be rendered, e.g., after the transistor gated by the TRKWL signal 315 is turned on and before the transistor gated by the TRKWL_RET signal 317 is turned on. In various embodiments of the present disclosure, the RC detector 330 can utilize such a time window to advance pulling down the TRKBL signal 319, upon detecting or otherwise identifying a certain operating condition of the memory device 100.

Figure 4:
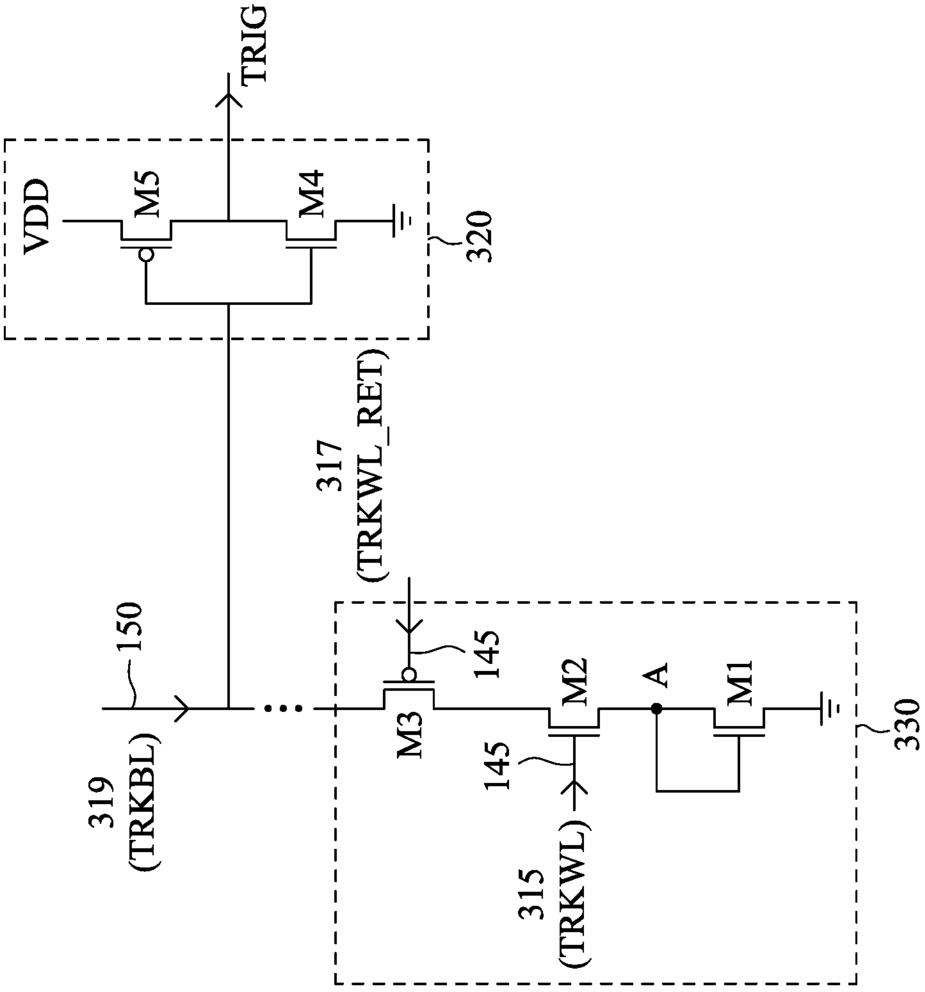
FIG. 4 illustrates a schematic diagram of an RC detector of the memory controller of FIG. 1, in accordance with some embodiments.

FIG. 4 illustrates a schematic diagram of the RC detector 330 and a portion of the pulse generator 320, in accordance with various embodiments. The schematic diagram of FIG. 4 is simplified for illustrative purposes, and thus, it should be appreciated that the RC detector 330 and the pulse generator 320 can each include any of various other components while remaining within the scope of the present disclosure.

As shown, the RC detector 330 includes transistors M1, M2, and M3 connected to each other in series, and further coupled between ground and the tracking bit line 150. The pulse generator 320 includes transistors M4 and M5 configured as an inverter. In some embodiments, the transistors M1, M2, and M4 are each implemented as an n-type metal-oxide-semiconductor field-effect-transistor (MOSFET), and the transistors M3 and M5 are each implemented as a p-type MOSFET. However, it should be understood that the transistors M1 to M5 can each be embodied as any of various other transistors, while remaining within the scope of the present disclosure.

Specifically, the transistor M1 is configured as being diode-connected, e.g., with its gate terminal and drain terminal tying to each another and its source terminal connected to ground. The transistor M2 is configured to be gated by the TRKWL signal 315, e.g., by coupling the gate terminal to the first horizontal portion of the tracking word line 145. The transistor M2 has it drain terminal and source terminal connected to the transistor M3 and the transistor M2, respectively. The transistor M3 is configured to be gated by the TRKWL_RET signal 317, e.g., by coupling the gate terminal to the second horizontal portion of the tracking word line 145. The transistor M3 has it drain terminal and source terminal connected to the transistor M2 and the tracking bit line 150, respectively. The transistors M4 and M5, configured as an invertor, have their gates commonly coupled to the tracking bit line 150 (to receive the TRKBL signal 319) and their connected drain terminals coupled to a control pin for outputting the TRIG signal. Alternatively stated, the invertor, formed by the transistors M4 and M5, can logically inverse the TRKBL signal 319 as the TRIG signal.

To advance pulling down the TRKBL signal, operation of the RC detector 330 will be briefly illustrated as follows. For example, a common node "A" connecting the transistors M1 and M2 may be kept at a substantially constant level through the diode-connected transistor M1. A voltage level present at the node A is about the same as a threshold voltage of the transistor M1 (e.g., about 400 millivolts). As such, when the TRKWL signal is provided with a logic high state and at a higher voltage level (e.g., when the memory device 100 operates with a high-voltage/temperature condition), the transistor M2 can be turned on to conduct more current to advance a timing of pulling down the TRKBL signal. This can happen before the TRKWL_RET signal returns from the tracking word line 145 (i.e., remaining at logic low state). Stated another way, when the transistor M3 pulls the TRKBL signal to low, the transistor M3 remains turned on until the TRKWL_RET signal returns with a logic high state. Thus, it can be appreciated that the TRKBL signal can be pulled down before the TRKWL_RET signal returns, which advantageously solves the RC delay issues that the existing memory device commonly faces. In some embodiments, such an advantage can be better appreciated when the memory device 100 operates with a high-voltage/temperature condition.

Figure 5:
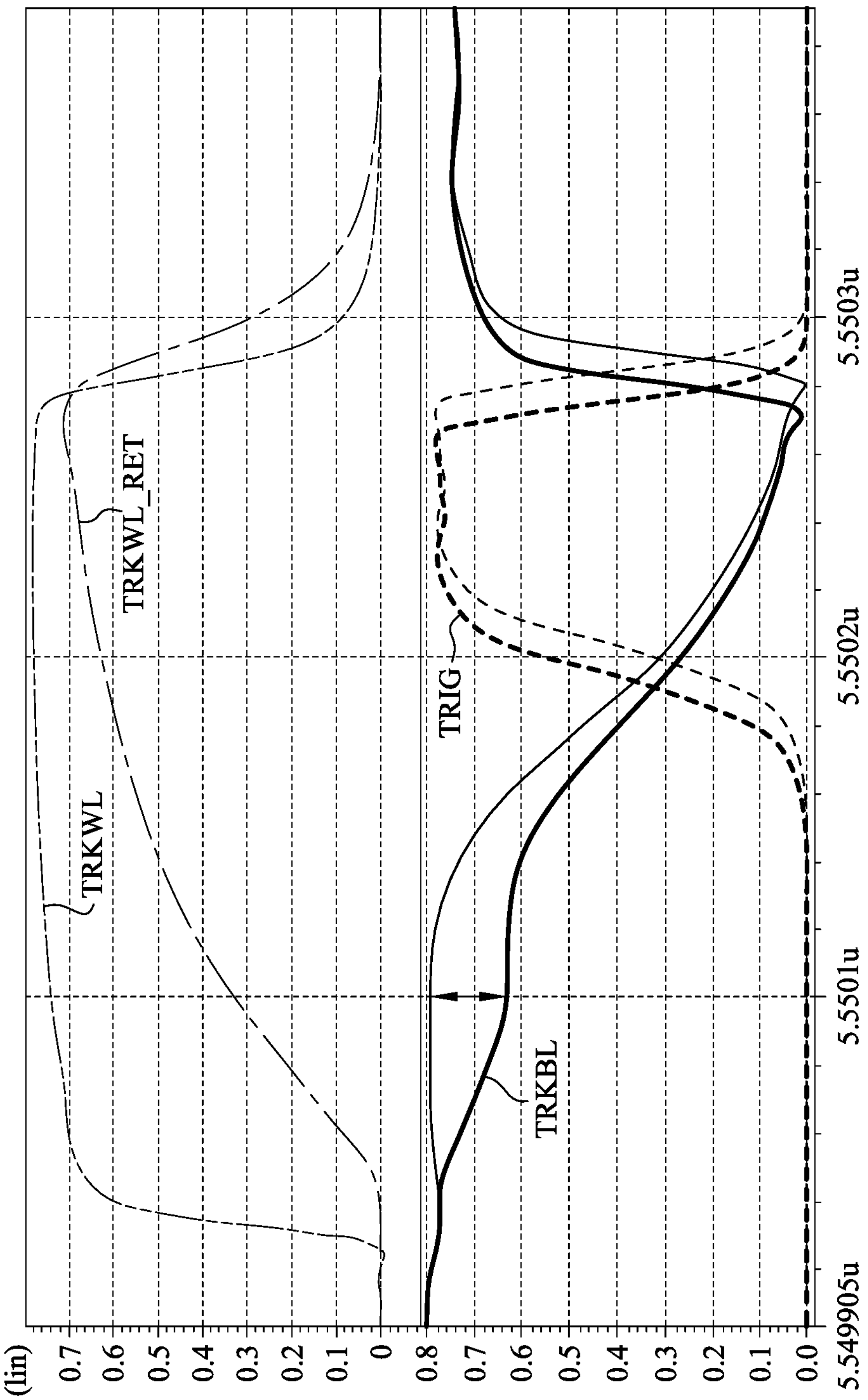
FIGS. 5 and 6 illustrate waveforms of various signals when the memory device of FIG. 1 operates with a high-voltage/temperature condition and a low-voltage/temperature condition, respectively, in accordance with some embodiments.
Figure 6:
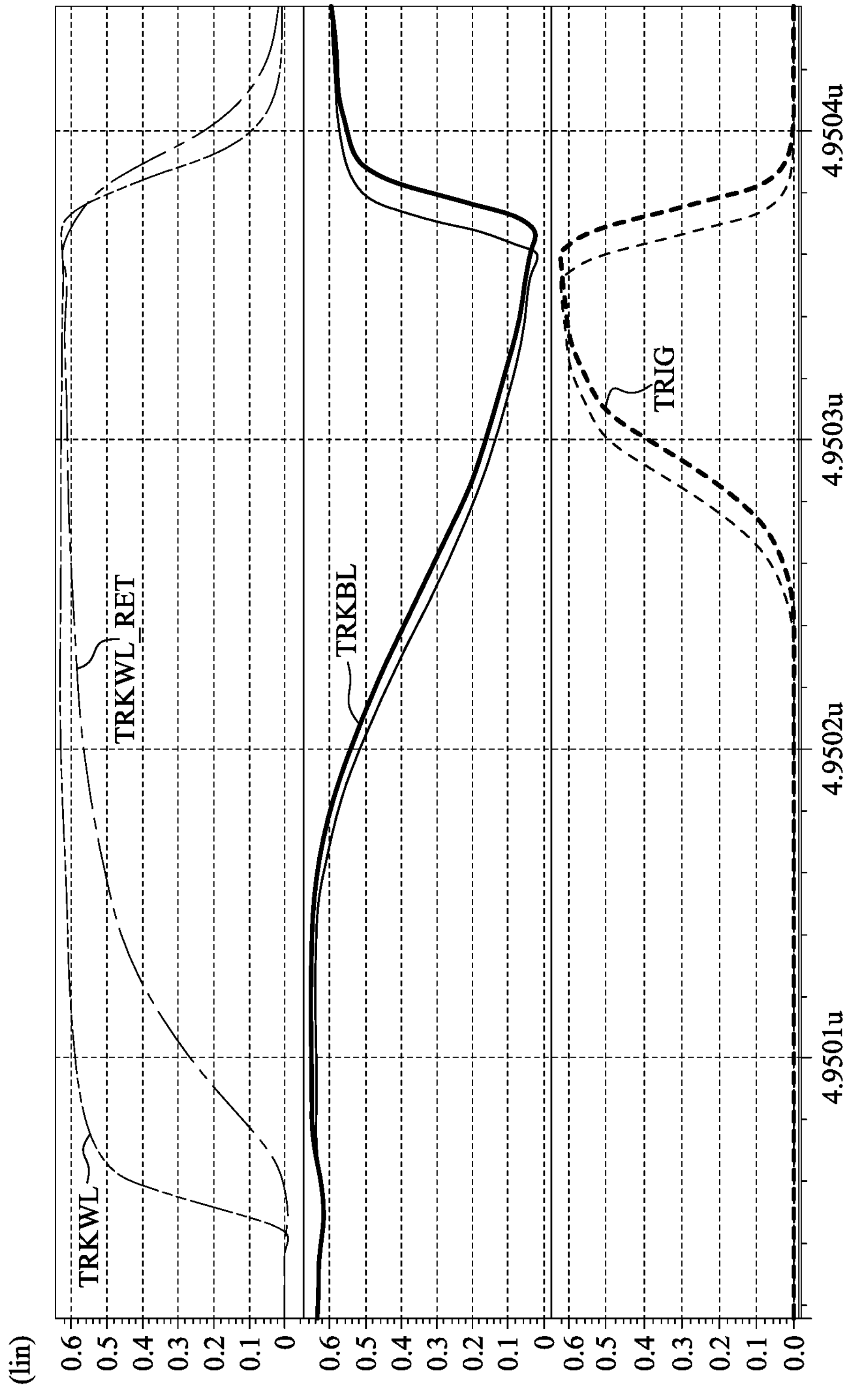

FIGS. 5 and 6 illustrate some of these signals generated or adjusted by the RC detector 330, in accordance with various embodiments of the present disclosure. For example, FIG. 5 illustrates waveforms of the TRKWL signal 315, the TRKWL_RET signal 317, the TRKBL signal 319, and the TRIG signal, when the memory device operates under a first condition, and FIG. 6 illustrates waveforms of these signals when the memory device operates under a second condition. In some embodiments, the first condition may correspond to a high-voltage and/or high-temperature operating condition (e.g., with the TRKWL signal being provided at a higher voltage level), and the second condition may correspond to a low-voltage and/or low-temperature operating condition (e.g., with the TRKWL signal being provided as a lower voltage level).

Referring first to FIG. 5, when the TRKWL signal is provided and pulled to high, the transistor M2 is activated. Given that the voltage at the node A is kept at a substantially constant level through the diode-connected transistor M1 and the TRKWL signal is pulled up to a higher voltage level (e.g., above about 0.7 volts), the transistor M2 conducts a higher current to advance pulling down the TRKBL signal. In comparison, a waveform of the TRKBL signal presented by the memory device that does not include the disclosed RC detector 330 is shown in a dotted line, while the waveform of the TRKBL signal adjusted by the RC detector 330 is shown in a solid line. As illustrated, a timing of the TRKBL signal starts to fall is advanced. In turn, a timing of the TRIG signal to rise can be advanced based on the adjusted TRKBL signal (a solid line), when compared to the TRIG signal generated by the existing memory device (a dotted line). Referring next to FIG. 6, the TRKWL signal is pulled up to a lower voltage level (e.g., below about 0.6 volts), the transistor M2 still conducts a current but it may not advance pulling down the TRKBL signal. Accordingly, the timings of the falling edges of the TRKBL signals, presented by the RC detector 330 and the existing memory device, respectively, may be similar, which in turn causes the timings of the rising edges of the respective TRIG signals to be similar.

Figure 7:
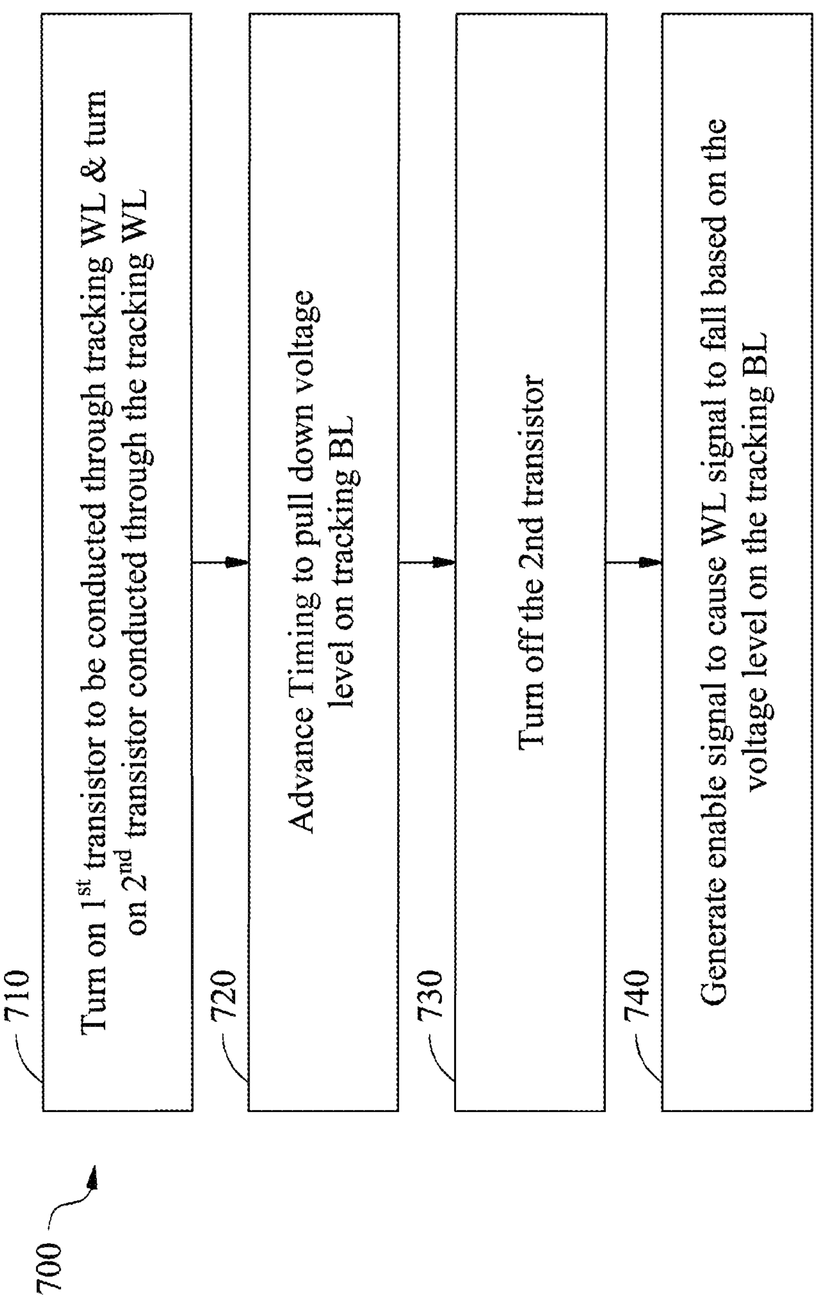
FIG. 7 illustrates an example flow chart of a method for operating a memory device, in accordance with some embodiments.

FIG. 7 illustrates a flow chart of an example method 700 for adjusting the pulse width of a WL signal conducted through an asserted word line WL based on the operating condition of a corresponding memory device, in accordance with various embodiments of the present disclosure. The method 700 may be performed to operate the memory device 100 (FIG. 1), and thus, in the following discussion of operations of the methods 700, the reference numerals used in FIGS. 1-6 may be reused. It is noted that the method 700 is merely an example and is not intended to limit the present disclosure. Accordingly, it is understood that additional operations may be provided before, during, and after the method 700 of FIG. 7, and that some other operations may only be briefly described herein.

The method 700 starts with operation 710 of turning on a first transistor of an RC detector by a first tracking signal provided to conduct through a tracking word line and turning on a second transistor of the RC detector by a second tracking signal to be conducted through the tracking word line. For example, the first transistor and second transistor may be non-limiting implementation of the transistors M2 and M3 shown in FIG. 4, respectively. In some embodiments, the transistor M2 is gated by the TRKWL signal, which is provided to flow through at least the first and second horizontal portions of the tracking word line 145, and the transistor M3 is gated by the TRKWL_RET signal, which is the signal conducted through the first and second horizontal portions of the tracking word line 145. As such, the TRKWL_RET signal can mimic the RC delay of a nominal word line. Stated another way, the TRKWL_RET signal may follow the TRKWL signal but with a time offset/window (e.g., delay). Such a time window may vary according to the operating condition of the memory device 100. For example, such a time window becomes larger when the memory device 100 operates with a high-voltage/temperature condition, and becomes smaller when the memory device 100 operates with a low-voltage/temperature condition.

The method 700 proceeds to operation 720 of advancing a timing to pull down a voltage level present on a tracking bit line. Continuing with the above example, upon being turned on by the pulled-high TRKWL signal, the (first) transistor M2 can start pulling down the voltage presented on the tracking bit line 150 (i.e., the TRKBL signal), and does not need to wait until the TRKWL_RET signal returns from the tracking word line 145. Further, before the TRKWL_RET signal returns (with a logic high state), the (second) transistor M3 can remain activated to enable the (first) transistor M2 to pull down the TRKBL signal. Stated another way, a timing of the TRKBL signal to fall can be advantageously advanced.

The method 700 proceeds to operation 730 of turning off the second transistor by the second tracking signal conducted through the tracking word line. Still with the same example, upon the TRKWL_RET signal returning from the horizontal portions of the tracking word line 145 (with a logic high state), the (second) transistor M3 can be turned off. As such, a conduction path extending from the tracking bit line, through the transistors M3 and M2, and to ground is disconnected, thereby ceasing the pulling-down of the TRKBL signal.

The method 700 proceeds to operation 740 of generating an enable signal to cause a word line signal to fall, in response to the voltage level on the tracking bit line falling to a threshold. Still with the same example, upon the TRKBL signal falling to a certain voltage level, the pulse generator 320 can fire the TRIG signal with a logic high state, thereby causing the SAE signal to rise. Upon the SAE signal rising to a certain voltage level, the WL signal may start to fall. As such, a pulse width of the WL signal can be adjusted.

In one aspect of the present disclosure, a memory circuit is disclosed. The memory circuit includes a memory array comprising a plurality of memory cells, and a controller operatively coupled to the memory array and comprising an RC detector. The RC detector is configured to adjust a timing of a falling edge of a first tracking signal based on a rising edge of a second tracking signal and a rising edge of a third tracking signal.

In another aspect of the present disclosure, a memory circuit is disclosed. The memory circuit includes a memory array comprising a plurality of memory cells arranged over a plurality of word lines and along a bit line, and a controller operatively coupled to the memory array and comprising an RC detector. The RC detector is configured to advance a timing for a first tracking signal to fall, subsequently to a second tracking signal transitioning to rise and prior to a third tracking signal transitioning to rise. The first tracking signal is conducted through a first tracking line, the second tracking signal is provided to conduct through a second tracking line, and the third tracking signal is conducted through the second tracking line.

In yet another aspect of the present disclosure, a method for operating a memory circuit is disclosed. The method includes turning on a first transistor by a first tracking signal provided to conduct through a tracking word line and turning on a second transistor by a second tracking signal to be conducted through the tracking word line. The method includes advancing a timing to pull down a voltage level present on a tracking bit line. The method includes turning off the second transistor by the second tracking signal conducted through the tracking word line. The method includes in response to the voltage level on the tracking bit line falling to a threshold, generating an enable signal to cause a word line signal to fall.

As used herein, the terms "about" and "approximately" generally indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit, comprising:
- a memory array comprising a plurality of memory cells; and
- a controller operatively coupled to the memory array and comprising an RC detector;
- wherein the RC detector comprises:
  - a first transistor that is diode-connected;
  - a second transistor; and
  - a third transistor;
  - wherein the first to third transistor are coupled to one another in series;
- wherein the RC detector is configured to adjust a timing of a falling edge of a first tracking signal based on a rising edge of a second tracking signal and a rising edge of a third tracking signal.

2. The memory circuit of claim 1, wherein the first tracking signal is conducted through a first tracking line, the second tracking signal is provided to conduct through a second tracking line, and the third tracking signal is conducted through the second tracking line.

3. The memory circuit of claim 2, wherein the second tracking line has a first portion extending from a first edge of the memory array to a midpoint of the memory array along a first lateral direction and a second portion extending from the midpoint of the memory array to the first edge of the memory array along the first lateral direction, and the first tracking line extends from a second edge of the memory array to a third edge of the memory array along a second lateral direction perpendicular to the first lateral direction.

4. The memory circuit of claim 2, wherein the plurality of memory cells are arranged over a plurality of word lines and along a bit line, and wherein the second tracking line has a first portion and a second portion that each have a length about equal to one half of a length of the word lines, and the first tracking line has a length about equal to a length of the bit line.

5. The memory circuit of claim 1, wherein the second transistor is gated by the second tracking signal, and the third transistor is gated by the third tracking signal.

6. The memory circuit of claim 1, wherein the second transistor and the third transistor have opposite conductive types.

7. The memory circuit of claim 1, wherein the first transistor has one of its source/drain terminals coupled to ground and the third transistor has one of its source/drain terminals coupled to the first tracking signal.

8. The memory circuit of claim 1, wherein the diode-connected first transistor is configured to maintain a voltage level, present at a first source/drain terminal of the second transistor, about equal to a threshold voltage of the first transistor, thereby advancing the timing of the falling edge of the first tracking signal when the memory array operates under a high-voltage condition.

9. The memory circuit of claim 8, wherein a second source/drain terminal of the second transistor is connected to a first source/drain terminal of the third transistor, with a second source/drain terminal of the third transistor configured to receive the first tracking signal.

10. The memory circuit of claim 1, wherein the first tracking signal is pre-charged to a high logic state prior to activation of the RC detector.

11. A memory circuit, comprising:

a memory array comprising a plurality of memory cells arranged over a plurality of word lines and along a bit line; and a controller operatively coupled to the memory array and comprising an RC detector;

wherein the RC detector comprises:

a first transistor that is diode-connected;

a second transistor; and a third transistor;

wherein the first to third transistor are coupled to one another in series;

wherein the RC detector is configured to advance a timing for a first tracking signal to fall, subsequently to a second tracking signal transitioning to rise and prior to a third tracking signal reaching a high logic state;

wherein the first tracking signal is conducted through a first tracking line, the second tracking signal is provided to conduct through a second tracking line, and the third tracking signal is conducted through the second tracking line.

12. The memory circuit of claim 11, wherein the second tracking line is configured to mimic each of the word lines, and the first tracking line is configured to mimic the bit line.

13. The memory circuit of claim 11, wherein the second transistor is gated by the second tracking signal, and the third transistor is gated by the third tracking signal.

14. The memory circuit of claim 11, wherein the second transistor and the third transistor have opposite conductive types.

15. The memory circuit of claim 11, wherein the first transistor has one of its source/drain terminals coupled to ground and the third transistor has one of its source/drain terminals coupled to the first tracking signal.

16. The memory circuit of claim 11, wherein the diode-connected first transistor is configured to pull down a voltage level, present at a first source/drain terminal of the second transistor, closer to ground based on an operating condition of the memory array, thereby advancing the timing of the falling edge of the first tracking signal.

17. The memory circuit of claim 16, wherein a second source/drain terminal of the second transistor is connected to a first source/drain terminal of the third transistor, with a second source/drain terminal of the third transistor configured to receive the first tracking signal.

18. The memory circuit of claim 11, wherein the first tracking signal is pre-charged to a high logic state prior to activation of the RC detector.

19. A method for operating a memory circuit, comprising:

turning on a first transistor by a first tracking signal provided to conduct through a tracking word line and turning on a second transistor by a second tracking signal to be conducted through the tracking word line;

advancing a timing to pull down a voltage level present on a tracking bit line;

turning off the second transistor by the second tracking signal conducted through the tracking word line; and in response to the voltage level on the tracking bit line falling to a threshold, generating an enable signal to cause a word line signal to fall.

20. The method of claim 19, further comprising:

in response to the first tracking signal being provided with a certain voltage level, turning on the first transistor with its drain terminal coupled to the tracking bit line and source terminal maintained at an almost constant voltage level, so as to advance pulling down the voltage level on the tracking bit line prior to the second transistor being turned off.

* * * * *